(12) United States Patent
Ikemura

(10) Patent No.: US 6,343,355 B1
(45) Date of Patent: Jan. 29, 2002

(54) SEQUENCE CONTROLLER CAPABLE OF EXECUTING DIFFERENT KINDS OF PROCESSING AT RESPECTIVE PERIODS

(75) Inventor: Kuniichi Ikemura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/261,462

(22) Filed: Feb. 24, 1999

(30) Foreign Application Priority Data

Feb. 24, 1998 (JP) ............................................. 10-041445

(51) Int. Cl.[7] ............................................. G06F 12/06
(52) U.S. Cl. ........................ 711/217; 711/218; 365/233; 365/236
(58) Field of Search ................................. 711/218, 217, 711/167, 5, 103, 154; 365/236, 233

(56) References Cited

U.S. PATENT DOCUMENTS

| | | | |
|---|---|---|---|
| 4,456,967 A | 6/1984 | Kuze | 713/600 |
| 4,467,458 A | 8/1984 | Kuze | 365/236 |
| 4,896,266 A | 1/1990 | Klashka et al. | 710/45 |
| 5,189,671 A | 2/1993 | Cheng | 370/471 |
| 5,317,724 A | 5/1994 | Clippard | 711/5 |
| 5,321,350 A | * 6/1994 | Haas | 324/76.11 |
| 5,644,747 A | 7/1997 | Kusuda | 711/2 |
| 5,651,128 A | * 7/1997 | Gaultier | 711/103 |

FOREIGN PATENT DOCUMENTS

| | | |
|---|---|---|
| JP | 58-214908 | 12/1983 |
| JP | 7-120176 | 12/1995 |

* cited by examiner

Primary Examiner—Matthew Kim
Assistant Examiner—Pierre-Michel Bataille
(74) Attorney, Agent, or Firm—Venable; Michael A. Sartori; Jeffrey W. Gluck

(57) ABSTRACT

A sequence controller includes a sequencer to which a basic clock is applied. The sequencer sequentially generates at a period of 125 $\mu$sec address signals for reading statements to be executed at a period of 125 $\mu$sec and one block of statements to be executed at a period of 10 msec or one block of statements to be executed at a period of 100 msec. A memory stores the above statements beforehand. The statements are selectively read out of the memory in accordance with the address signals and fed to a decoder. The decoder decodes the statements and generates control signals respectively corresponding to the statements and feeds the control signals to a switch. The switch controls each of a plurality of function registers on the basis of the respective control signal.

16 Claims, 6 Drawing Sheets

SEQUENCE CONTROLLER CAPABLE OF EXECUTING DIFFERENT KINDS OF PROCESSING AT RESPECTIVE PERIODS

BACKGROUND OF THE INVENTION

1. Field of the Invention

The present invention relates to a sequence controller and more particularly to a sequence controller capable of executing control having an extremely short period and control having a relatively long period with a single circuitry.

2. Description of the Background Art

It is a common practice with a transmission system monitor and control apparatus to collect various kinds of alarm signals from transmission frames, process the collected alarm signals, and send the processed alarm signals to an upper layer apparatus. For example, the monitor and control apparatus outputs an alarm signal on detecting a transmission error once or more every second or on detecting it N consecutive times, and then recovers when not detecting it M or more consecutive times. Because such alarm processing often differs from one apparatus to another apparatus, a microprocessor has heretofore been extensively used in order to flexibly adapt to the alarm processing. However, a microprocessor is not applicable to a monitor and control apparatus of the type monitoring transmission frames having a period of, e.g., 125 μsec frame by frame and therefore needing high speed processing.

In light of the above, Japanese patent publication No. 120176/1995, for example discloses a programmable controller applicable to an NC (Numerical Control) apparatus. The programmable controller divides process sequences into a group of urgent sequences and a plurality of groups of usual sequences. All of such sequences are cyclically executed with the group of urgent sequences alternating with the group of usual sequences, so that the urgent sequences can be executed at a short period.

However, the above programmable controller relies on a microprocessor whose processing speed is limited. This prevents the programmable controller from being applied to an apparatus required to execute processing at a period as short as 125 μsec by way of example. Should processing with a short period and processing with a long period each be executed by a respective circuit, the entire circuit scale and therefore the cost would increase.

SUMMARY OF THE INVENTION

It is therefore an object of the present invention to provide a sequence controller capable of surely detecting an event occurring at a short period, e.g., the condition of a transmission path and executing, with a single circuitry, processing having a short period to be executed within the above period and processing having a relatively long period.

In accordance with the present invention, a sequence controller includes a memory storing beforehand basic period processing information to be executed at a basic period and time division period processing information to be executed at a time division period which is an integral multiple of the basic period. An address generating circuit continuously generates, at the basic period, addresses for reading the basic period processing information out of the memory and addresses for reading, one block at a time, the time division period processing information at the basic period and reads all of the blocks at the time division period out of the memory.

Also, in accordance with the present invention, a sequence controller includes a memory storing beforehand basic period processing information to be executed at a basic period and a plurality of time division period processing information to be executed at time division periods which are integral multiples of the basic period. An address generating circuit continuously generates, at the basic period, addresses for reading the basic period processing information out of the memory and addresses for reading, one block at a time, the plurality of time division period processing information at the basic period and reads all of the blocks of each of the time division period processing information at a respective time division period out of the memory.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
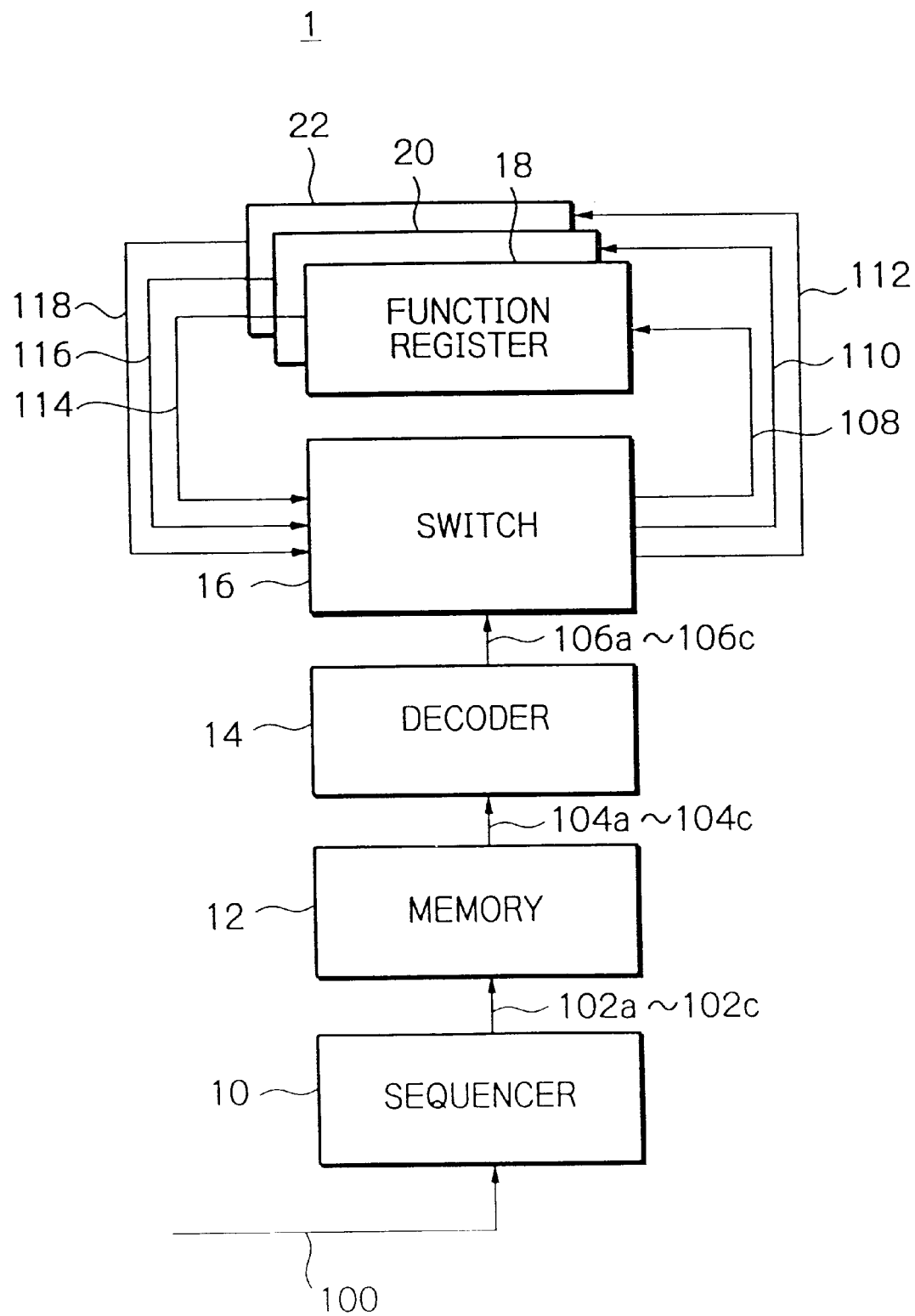
FIG. 1 is a block diagram schematically showing a sequence controller embodying the present invention.

Referring to FIG. 1 of the drawings, a sequence controller embodying the present invention is shown and generally designated by the reference numeral 1. In the illustrative embodiment, the sequence controller 1 is constructed to execute each of three different kinds of control at a basic period, e.g., 125 μsec or at time division periods which are integral multiples of the basic period, e.g., 10 msec and 100 msec. As shown in FIG. 1, the sequence controller 1 includes a sequencer 10 for generating address signals 102a–102c and feeding them to a memory 12.

Figure 2:
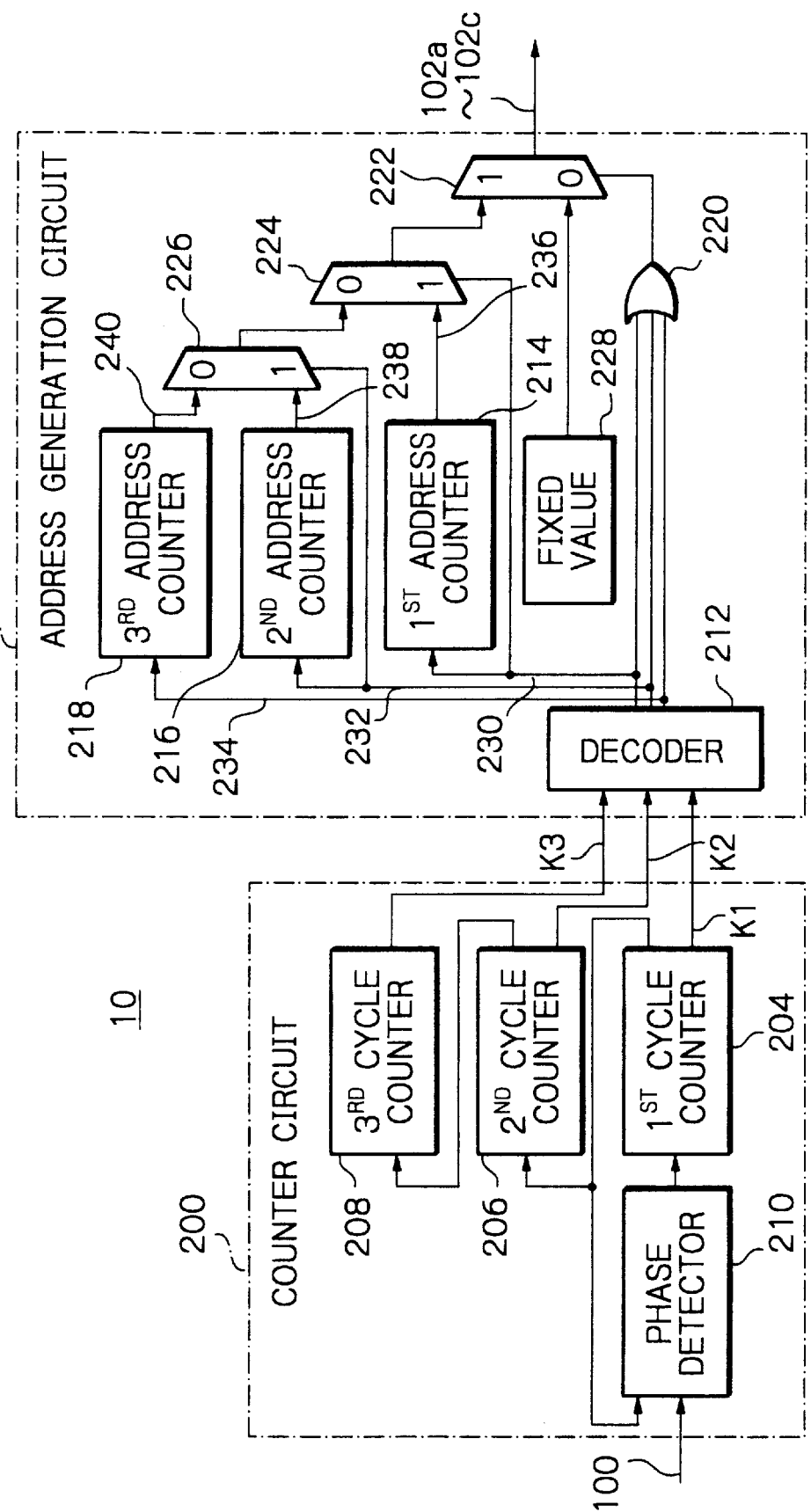
FIG. 2 is a block diagram schematically showing a specific configuration of a sequencer included in the illustrative embodiment.

FIG. 2 shows a specific configuration of the sequencer 10. As shown, the sequencer 10 is generally made up of a counter circuit 200 and an address generation circuit 202. The counter circuit 200 has a first cycle counter 204, a second cycle counter 206, a third cycle counter 208, and a phase detector 210. The first cycle counter 204 counts, in synchronism with an input reference clock 100 generated in an apparatus including the sequence controller 1, a high speed clock of several megahertz generated in the counter circuit 200. The resulting count K1 output from the first cycle counter 204 is input to a decoder 212 included in the address generation circuit 202. The cycle counter 204 repeats such an operation at the basic period, e.g., 125 μsec. Further, the cycle counter 204 produces pulses having a period of 125 μsec from the above high speed clock and feeds them to either one of the second cycle counter 206 and phase detector 210.

The second cycle counter 206 counts the pulses output from the first cycle counter 204 and having the period of 125 μsec and delivers the resulting count K2 to the decoder 212.

The cycle counter 206 repeats this operation at a period of 10 msec. Further, the cycle counter 206 produces pulses having a period of 10 msec from the 125 µsec pulses output from the first cycle counter 204 and feeds them to the third cycle counter 208. The third cycle counter 208 counts the 10 msec pulses output from the second cycle counter 206 and delivers the resulting count K3 to the decoder 212. The cycle counter 208 repeats this operation at a period of 100 msec.

The phase detector 210 determines a difference in phase between the input reference clock 100 and the 125 µsec pulses output from the first cycle counter 204 and inputs the difference to the cycle counter 204. The cycle counter 204 increases or decreases the number of high speed clock pulses to count in accordance with the input phase difference. Therefore, the phase of the cycle counter 204 can adequately follow the phase of the reference clock 100. That is, the cycle counter 204 can accurately count the high speed clock pulses in synchronism with the reference clock 100. If desired, a PLL (Phase Locked Loop) circuit operable in synchronism with the reference clock 100 may be used to output a high frequency clock to be counted by the cycle counter 204.

In the address generation circuit 202, the decoder 212 decodes the counts K1–K3 input from the first to third cycle counters 204–208, respectively, and generates timing signals 230, 232 and 234. The timing signals 230, 232 and 234 are fed to a first, a second and a third address counter 214, 216 and 218, respectively. At the same time, the timing signals 230–234 are input to an OR gate 220. The OR gate 220 produces an OR of the timing signals 230–234 and delivers the OR to a selector 222.

On receiving the timing signal 230 from the decoder 212, the first address counter 214 generates addresses for reading statements to be processed at the basic period of 125 µsec out of the memory 12, FIG. 1. Each of the addresses generated by the address counter 214 is input to a selector 224 as an address signal 236. Likewise, the second address counter 216 generates, in response to the timing signal 232, addresses for reading statements to be processed at the period of 10 msec out of the memory 12, FIG. 1. Each of the addresses generated by the address counter 216 is input to another selector 226 as an address signal 238. Further, the third address counter 218 generates, response to the timing signal 234, addresses for reading statements to be processed at the period of 100 msec out of the memory 12, FIG. 1. Each of the addresses generated by the address counter 218 are also input to the selector 226 as an address signal 240.

When the timing signal 232 output from the decoder 212 is a (logical) ONE, the selector 226 selects the address signal 238 output from the second address counter 216. When the timing signal 232 is a (logical) ZERO, the selector 226 selects the address signal 240 output from the third address counter 218. The address signal 238 or 240 selected is applied to the selector 224. The selector 224 selects the address signal 236 output from the first address counter 214 when the timing signal 230 is a ONE or selects the address signal selected by the selector 226 when it is a ZERO. The signal selected by the selector 224 is input to the selector 222. The selector 222 selects the address signal selected by the selector 224 when the output of the OR gate 220 is a ONE or selects a fixed value (NOP) 228 when it is a ZERO. The fixed value 228 is used to invalidate the execution of a statement. The address signals 236–240 are fed to the memory 12, FIG. 1 as the previously mentioned address signals 102a–102c, respectively.

Figure 3:
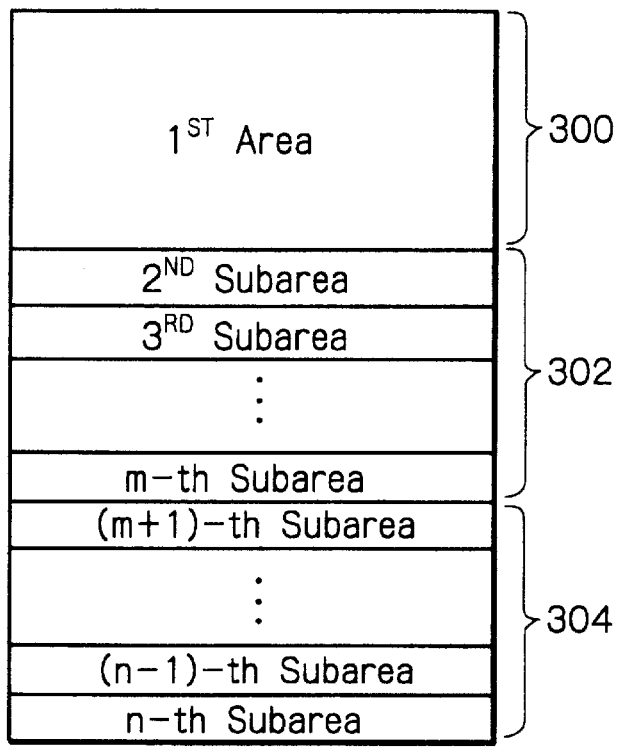
FIG. 3 shows a specific arrangement of memory areas in a memory also included in the illustrative embodiment.

The memory 12 stores beforehand a plurality of fixed statements each designating a particular control method. As shown in FIG. 3 specifically, the memory 12 stores such statements by classifying them according to the period of processing. As shown, statements designating control methods to be executed at the basic period (125 µsec) are stored in an area 300. Likewise, statements designating control methods to be executed at the periods of 10 msec and 100 msec are stored in areas 302 and 304, respectively. In each of the areas 300–304, the statements are stored in the order in which they are to be executed. This configuration of the memory 12 facilitates the generation of addresses allocated to the areas 300–304. On receiving any one of the address signals 102a–102c from the sequencer 10, the memory 12 reads one of statements 104a, 104b and 104c designated by the address signal out of the area 300, 302 or 304 storing it. The statements read out are fed from the memory 12 to the decoder 14.

The decoder 14 decodes the statements 104a–104c received from the memory 12 and generates control signals 106a–106c respectively corresponding to the statements 104a–104c for controlling a switch 16. In response to any one of the control signals 106a–106c, the switch 16 connects one of function registers 18, 20 and 22 and one of the remaining function registers 18–22. The function registers 18–22 are respectively used to, e.g., hold data, perform calculations, and interface the sequence controller 1 to the outside of the sequence controller 1. The function registers 18–22 respectively receive control signals 108–112 from the switch 16 and feed output signals 114–118 to the switch 16.

Reference will be made to FIGS. 2–5 for describing a specific operation of the sequence controller 1. First, the processing timings of the illustrative embodiment will be described. Assume that 125 µsec processing to be executed at the period of 125 µsec is implemented as the first block, that 10 msec processing to be executed at the period of 10 msec consists of the second block to the m-th block, i.e., (m−1) blocks in total, and that 100 msec processing to be executed at the period of 100 msec consists of the (m+1)-th block to the n-th block, i.e., (n−m) blocks in total. Also, assume that the area 300 (first area) of the memory 12 stores statements representative of the first block, that the area 302 stores statements representative of the second to n-th blocks in its second to m-th subareas, and that the area 304 stores statements representative of the (m+1)-th to n-th blocks in its (m+1)-th to n-th subareas.

Figure 4:
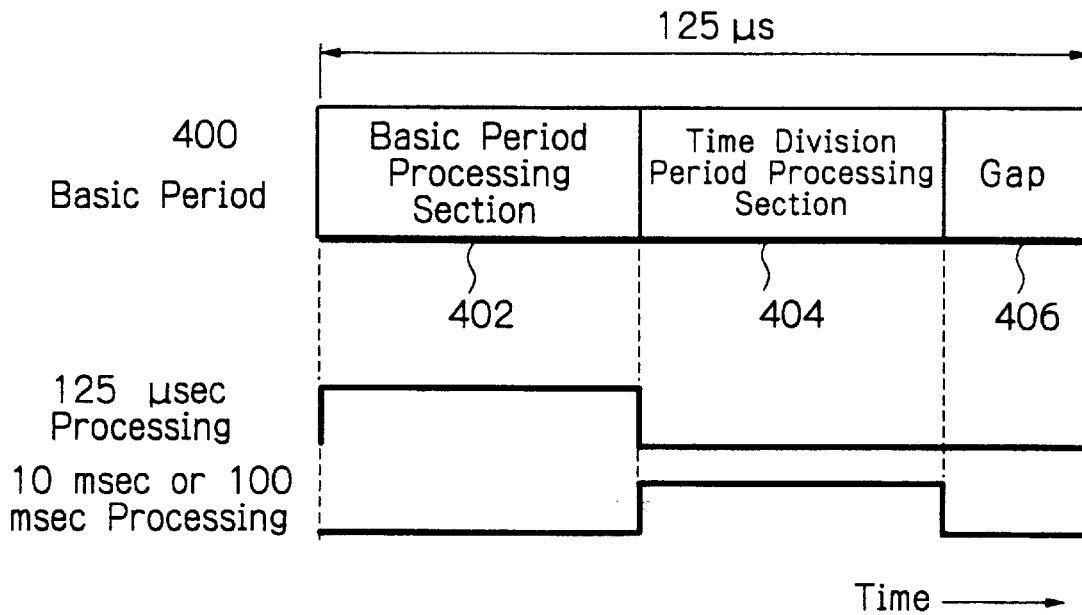
FIG. 4 is a timing chart showing a minimum cycle processing timing particular to the illustrative embodiment.

FIG. 4 is a timing chart showing a minimum cycle available with the sequence controller 1. As shown, in the illustrative embodiment, a basic period 400 is representative of a minimum cycle time which is 125 µsec. The basic period 400 is divided into three consecutive sections, i.e., a basic period processing section 402 for executing the processing of the basic period, a time division period processing section 404 for executing the processing of periods which are integral multiples of the basic period (10 msec and 100 msec in the illustrative embodiment), and a gap 406. The first block of the 125 µsec processing is executed in the basic period processing section 402. One of the second to m-th blocks of the 10 msec processing and the (m+1)-th to n-th blocks of the 100 msec processing is executed in the time division period processing section 404. The gap 406 is used to increase or decrease the number of high speed clock pulses to count, thereby adjusting the phase of the counter.

Figure 5:
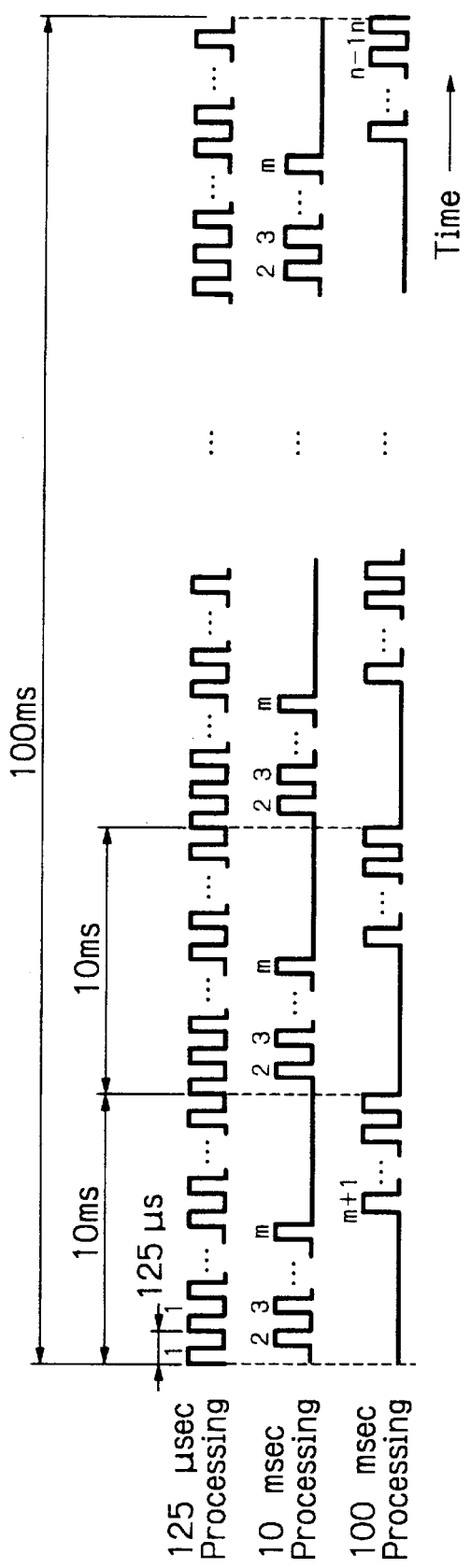
FIG. 5 is a timing chart demonstrating processing of different cycles particular to the illustrative embodiment.

FIG. 5 is a timing chart showing the 125 µsec processing, 10 msec processing and 100 msec processing occurring during a period of time of 10 msec. The timings shown in FIG. 5 are respectively corresponding to the timing signals 230–234 output from the decoder 212, FIG. 2. As shown, the first block of the 125 µsec processing is executed every 125

μsec. The second to m-th blocks of the 10 msec processing are sequentially executed, one block at a time, during the former half of a period of time of 10 msec every 125 μsec; all the blocks are executed before the former half of the above period of time expires. All of the second to m-th blocks of the 10 msec processing are executed every 10 msec.

As for the (m+1)-th to n-th blocks of the 100 msec processing, a plurality of blocks are sequentially executed, one block at a time, within the latter half of the period of time of 10 msec every 125 μsec. All of the (m+1)-th to n-th blocks are executed before a period of time of 100 msec expires, and are repeated every 100 msec. It should be noted that the first block is executed in the basic period processing section 402, FIG. 4, while the second to n-th blocks are executed in the time division period processing section 404, FIG. 4, as stated earlier. It should also be noted that the above sequence of block-by-block processing is only illustrative. The crux is that the second to m-th blocks and the (m+1)-th to n-th blocks be fully executed within 10 msec and 100 msec, respectively.

More specifically, the first and second blocks are sequentially executed in this order during the first 125 μsec of the first 10 msec. During the next 125 μsec, the first and third blocks are sequentially executed in this order. In this manner, the fourth to m-th blocks are sequentially executed in combination with the first block. After the execution of the m-th block, the first and (m+1)-th blocks are sequentially executed in this order during 125 μsec. In a similar way, the (m+2)-th block through the (m+l)-th block are sequentially executed in combination with the first block, where l=(n−m)/10.

During the next 10 msec, the second to m-th blocks of the 10 msec processing are again executed while the (m+l+11)-th to (m+2l)-th blocks of the 100 msec processing are executed. In the same manner, all the blocks of the 100 msec processing from (m+2l+1)-th to n-th are executed before 100 msec expires. As a result, during 100 msec, 800 blocks of the 125 μsec processing, (m−1)×10 blocks of the 10 msec processing, and (n−m) blocks of the 100 msec processing are executed in total.

As stated above, in the illustrative embodiment, the first block and any one of the second to n-th blocks are sequentially executed for every basic period of 125 μsec. The second to n-th blocks are executed on a time division basis, i.e., the second to m-th blocks and the (m+1)-th to n-th blocks are respectively executed every 10 msec and every 100 msec.

The operation of the sequence controller 1 shown in FIG. 1 is as follows. In the sequencer 10, the first cycle counter 204 continuously counts, in synchronism with the reference clock 100 (8 kHz), the high speed clock (several megahertz) over 125 μsec from the beginning of the basic period processing section 402. The number of the high speed clock counted over the basic period processing section 402 and time division period processing section 404 is input to the decoder 212 as a count K1. The gap 406 is assumed to be zero. At the same time, the above high speed clock is divided in frequency to form pulses having a period of 125 μsec. The resulting 125 μsec pulses are fed to the second cycle counter 206 and phase detector 210. The phase detector 210 determines a phase difference between the 125 μsec pulses and the reference clock 100. The first cycle counter 204 is so adjusted as to follow the phase of the reference clock 100 in accordance with the phase difference output from the phase detector 210.

The second cycle counter 206 continuously counts the input 125 μsec pulses over 10 msec and delivers the number of pulses to the decoder 212 as a count K2. The cycle counter 206 repeats the counting operation every 10 msec. At the same time, the 125 μsec pulses are divided in frequency to form pulses having a period of 10 msec. These 10 msec pulses are input to the third cycle counter 208. The third cycle counter 208 counts the input 10 msec pulses over 100 msec and delivers the number of pulses to the decoder 212 as a count K3. The cycle counter 208 repeats this operation every 100 msec.

The decoder 212 decodes the counts K1, K2 and K3 to thereby generate the previously mentioned timing signals 230, 232 and 234 at the respective timings shown in FIG. 5. The timing signals 230, 232 and 234 respectively cause the first, second and third counters 214, 216 and 218 to operate. Specifically, the timing signal 230 going high (ONE) in the basic period processing section 402, FIG. 4, is generated every 125 μsec. The timing signal 232 going high (ONE) in the time division period processing section 404 and going high (ONE) in the former half of the 10 msec period every 10 msec is generated every 125 μsec. Further, the timing signal 234 going high (ONE) in the time division period processing section 404 and going high (ONE) in the latter half of the 10 msec period every 10 msec is generated every 125 μsec.

The decoder 212 delivers the timing signals 230, 232 and 234 to the first address counter 214, second address counter 216 and third address counter 218, respectively. In response to the timing signal 230, the address counter 214 generates the address signal 236 for sequentially designating all of the addresses of the area (first area) 300 of the memory 12. The address counter 214 repeats the generation of such addresses every time it receives the timing signal 230. At this instant, the timing signal 230 output from the decoder 212 is input to the selector 224 while a ONE output from the OR gate 220 is input to the selector 222. As a result, the address signal 236 generated by the address counter 214 is output from the selector 222 via the selector 224.

In response to the timing signal 232, the address counter 216 selects one of the second to m-th subareas of the area 302 of the memory 12 and generates the address signal 238 for sequentially designating all of the addresses of the subarea selected. Specifically, the address counter 216 sequentially selects, one subarea at a time, the second to m-th subareas every time it receives the timing signal 232; the m-th subarea is again followed by the second subarea. At this instant, the timing signal 232 output from the decoder 212 is applied to the selector 226, but the timing signal 230 is not applied to the selector 224. This, combined with a ONE fed from the OR gate 220 to the selector 222, causes the address signal 238 to be output from the selector 222 via the selectors 226 and 224.

In response to the timing signal 234, the address counter 218 selects one of the (m+1)-th to n-th subareas of the area 304 of the memory 12 and generates the address signal 240 for sequentially designating all of the addresses of the subarea selected. Specifically, the address counter 218 sequentially selects, one subarea at a time, the (m+1)-th to n-th subareas every time it receives the timing signal 234; the n-th subarea is again followed by the (m+1)-th subarea. At this instant, a ONE output from the OR gate 220 is applied to the selector 222, but no timing signals are applied to the selectors 224 and 226. As a result, the address signal 240 output from the address counter 218 is output from the selector 222 via the selectors 226 and 224. The address signal 236, 238 or 240 output from the selector 222 is fed to the memory 12, FIG. 1, as the address signal 102a, 102b or 102c, respectively.

The memory 12 reads statements stored in the area or subarea designated by any one of the address signals 102a–102c. Specifically, in response to the address signal 102a, the memory 12 sequentially reads the statements stored in the area (first area) 300 while feeding them to the decoder 14 as the statements 104a. In response to the address signal 102b, the memory 12 sequentially reads the statements stored in any one of the second to m-th subareas of the area 302 while feeding them to the decoder 14 as the statements 104b. Further, in response to the address signal 102c, the memory 12 sequentially reads the statements stored in any one of the (m+1)-th to n-th subareas of the area 304 while feeding them to the decoder 14 as the statements 104c.

The decoder 14 therefore receives, every 125 μsec, all of the statements of the first block to be executed at the period of 125 μsec. Also, the decoder 14 receives, on a time division basis, the statements of the second to m-th blocks to be executed at the period of 10 msec, one block at a time, at the timing shown in FIG. 5. Further, the decoder 14 receives, on a time division basis, the statements of the (m+1)-th to n-th blocks to be executed at the period of 100 msec, one block at a time, at the timing shown in FIG. 5. The decoder 14 sequentially decodes the input statements 104a–104c and generates the control signals 106a–106c respectively corresponding to the statements 104a–104c in order to control the switch 16. The switch 16 selects one of the function registers 18–22 in response to the control signals 106a–106c, respectively.

As stated above, in the illustrative embodiment, the 125 μsec period processing and one block of the 10 msec period processing and 100 msec period processing are sequentially executed at the period of 125 μsec. All the blocks of the 10 msec period processing are executed within 10 msec while all the blocks of 100 msec period processing are executed within 100 msec. Therefore, the processing having the period of as short as 125 μsec and the processing having relatively long periods of 10 msec and 100 msec can be executed by sharing a single circuitry. As for transmission frames having a period of 125 μsec, for example, an alarm can be taken in for every frame in order to generate a preselected alarm signal every second only if a basic period of 125 μsec is selected.

Moreover, the illustrative embodiment uses exclusive circuitry including counters and a memory in place of the conventional program processing relying on a microprocessor. The embodiment can therefore readily execute even control with a short period without being effected by the processing ability of a microprocessor.

Figure 6:
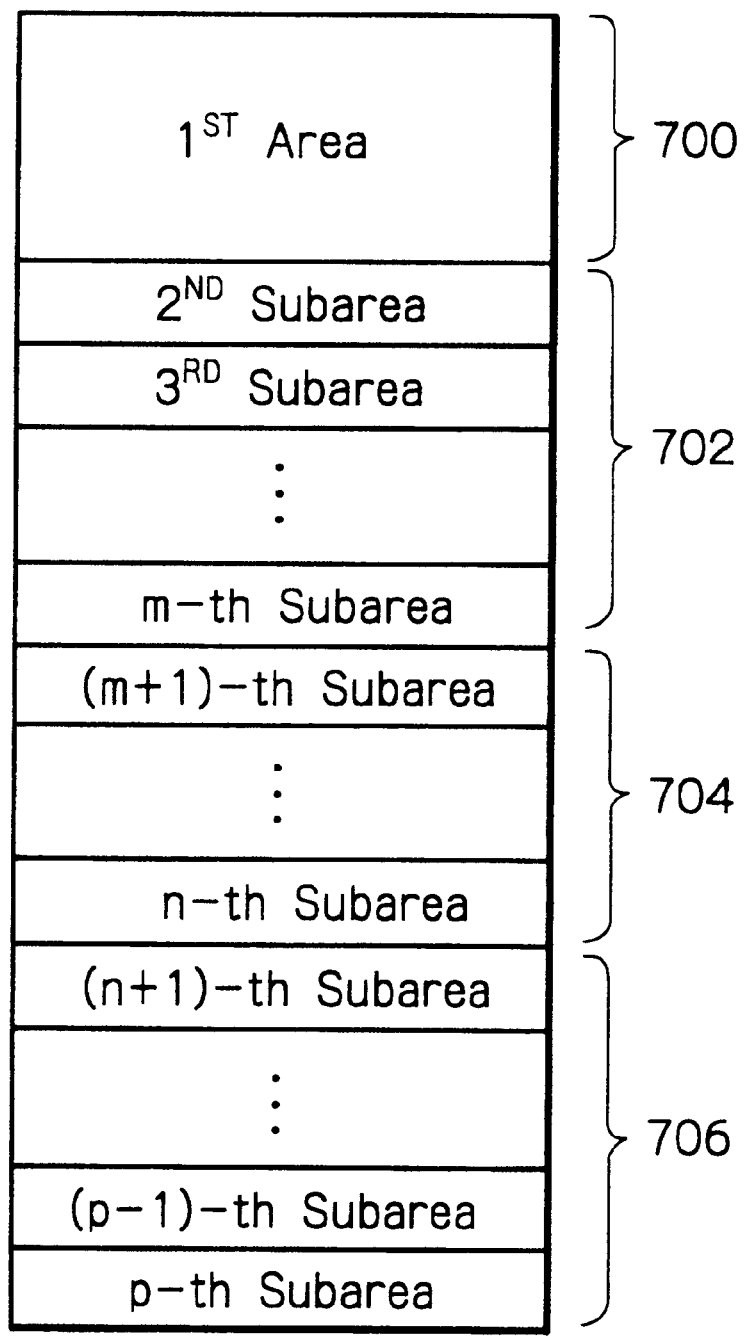
FIG. 6 shows another specific arrangement of memory areas in the memory.
Figure 7:
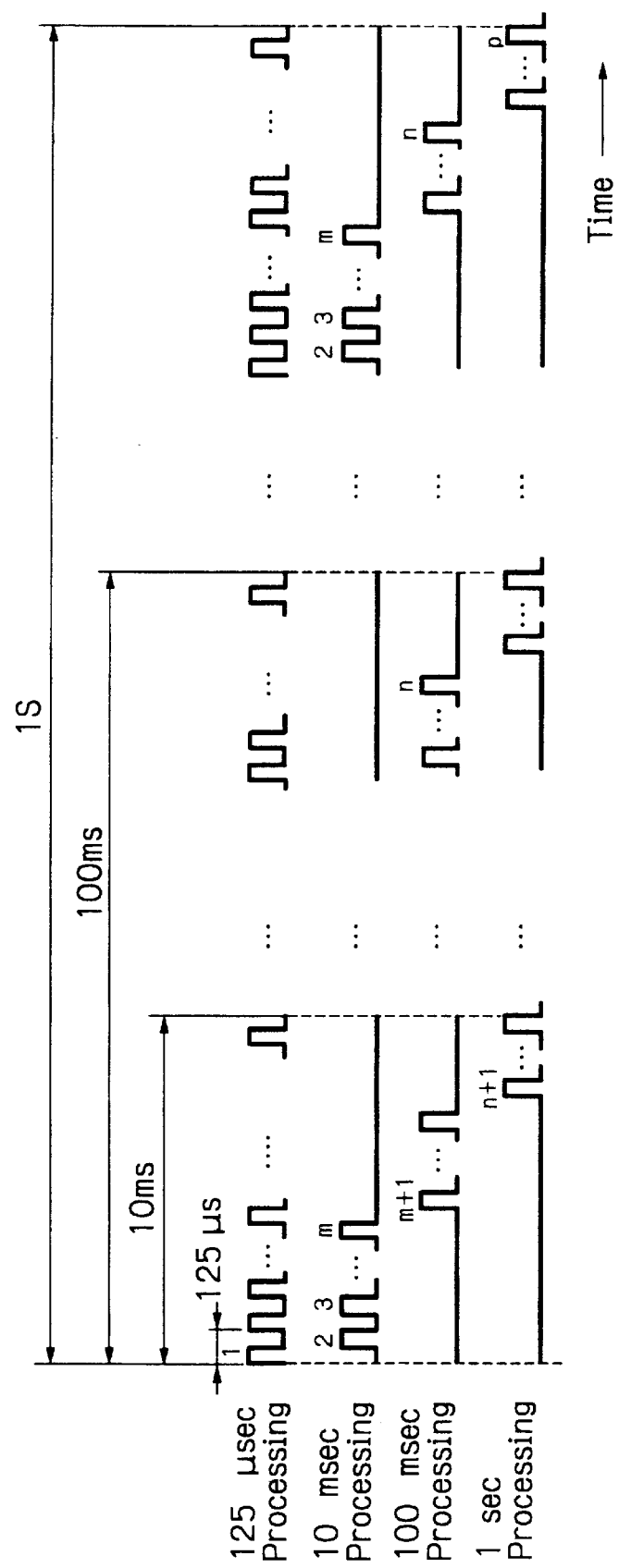
FIG. 7 is a timing chart showing a specific operation associated with the memory areas of FIG. 6.

In the above embodiment, the sequence controller executes the 125 μsec period processing, 10 msec period processing, and 100 msec period processing. Alternatively, assume that the sequence controller executes, e.g., 125 μsec period processing, 10 msec period processing, 100 msec period processing, and 1 sec period processing. Then, as shown in FIG. 6, the 125 μsec period processing is assigned to the first block, the 10 msec period processing is assigned to the second to m-th blocks, the 100 msec processing is assigned to the (m+1)-th to n-th blocks, and the 1 sec period processing is assigned to the (n+1)-th to p-th blocks. FIG. 7 shows timings at which the different kinds of processing of FIG. 6 are executed.

In summary, it will be seen that the present invention provides a sequence controller capable of executing, with a single circuitry, both of processing having a basic period and processing whose period is an integral multiple of the basic period. Further, with exclusive circuitry, the sequence controller of the present invention can execute even processing of the kind having a period which is too short to be executed by program processing relying on a microprocessor.

The entire disclosure of Japanese patent application No. 41445/1998 filed on Feb. 24, 1998 and including the specification, claims, accompanying drawings and abstract of the disclosure is incorporated herein by reference in its entirety.

While the present invention has been described with reference to the illustrative embodiment, it is not to be restricted by the embodiment. It is to be appreciated that those skilled in the art can change or modify the embodiment without departing from the scope and spirit of the present invention.

What is claimed is:

1. A sequence controller comprising:
    a first cycle counter for repeatedly counting a high speed clock at a basic period, the basic period consisting of a basic period processing section and a time division period processing section, and for generating a basic period pulse that has said basic period;
    a second cycle counter for repeatedly counting said basic period pulse at a time division period that is an integral multiple of said basic period;
    a memory for storing beforehand basic period processing information and time division period processing information which consists of a plurality of blocks;
    a decoder for decoding counts input from said first cycle counter and said second cycle counter and for generating predetermined timing signals;
    a first address counter for continuously generating, during the basic period processing section of said basic period, addresses for reading said basic period processing information out of said memory in accordance with said timing signals; and
    a second address counter for continuously generating, during the time division period processing section of said basic period, address for reading, one block at a time, said time division period processing information out of said memory in accordance with said timing signals.

2. A sequence controller in accordance with claim 1, wherein said memory stores said basic period processing information and said time division period processing information on a period basis.

3. A sequence controller in accordance with claim 1, wherein said basic period processing information and said time division period processing information comprise statements each for generating a particular control signal.

4. A sequence controller in accordance with claim 1, wherein said first cycle counter counts the high speed clock in synchronism with a reference clock generated within an apparatus including said sequence controller.

5. A sequence controller in accordance with claim 4, further comprising:
    a phase detector for maintaining synchronism between said basic period pulse generated by the first cycle counter and said reference clock.

6. A sequence controller in accordance with claim 1, further comprising:
    multiplexing logic for receiving the outputs of said first and second address counters and supplying memory address information.

7. A sequence controller in accordance with claim 6, further comprising:

memory means receiving said memory address information and reading out associated information;

a decoder arrangement receiving said associated information read out of the memory means and generating control signals.

8. A sequence controller comprising:

a first cycle counter for repeatedly counting a high speed clock at a basic period, said basic period consisting of a basic period processing section and a time division period processing section, and for generating a basic period pulse that has said basic period;

a second cycle counter for repeatedly counting said basic period pulse at a first time division period, said first time division period being an integral multiple of said basic period, and for generating a first time division period pulse that has said first time division period;

a third cycle counter for repeatedly counting said first time division period pulse at a second time division period, said second time division period being an integral multiple of said basic period;

a memory storing beforehand basic period processing, first time division period processing information, consisting of a plurality of blocks, and second time division period processing information, also consisting of a plurality of blocks;

a decoder for decoding counts input from said first cycle counter, said second cycle counter, and said third cycle counter and for generating predetermined timing signals;

a first address counter for continuously generating, during the basic period processing section of said basic period, addresses for reading said basic period processing information out of said memory in accordance with said timing signals;

a second address counter for continuously generating, during the time division period processing section of a respective basic period in a former half of said first time division, addresses for reading, one block at a time, said first time division period processing information out of said memory in accordance with said timing signals; and a third address counter for continuously generating, during the time division processing section of a respective basic period in a latter half of said first time division processing period, addresses for reading, one block at a time, said second time division period processing information out of said memory in accordance with said timing signals.

9. A sequence controller in accordance with claim 8, wherein said memory stores said basic period processing information and said time division period processing information on a period basis.

10. A sequence controller in accordance with claim 8, wherein said basic period processing information and said time division period processing information comprise statements each for generating a particular control signal.

11. A sequence controller in accordance with claim 8, wherein first cycle counter counts the high speed clock in synchronism with a reference clock generated within an apparatus including said sequence controller.

12. A sequence controller in accordance with claim 11, further comprising:

a phase detector for maintaining synchronism between said basic period pulse generated by the first cycle counter and said reference clock.

13. A sequence controller in accordance with claim 8, further comprising:

multiplexing logic for receiving the outputs of said first, second, and third address counters and supplying memory address information.

14. A sequence controller in accordance with claim 13, further comprising:

memory means receiving said memory address information and reading out associated information;

a decoder arrangement receiving said associated information read out of the memory means and generating control signals.

15. A sequence controller comprising:

a sequencer comprising:

a counter circuit, said counter circuit comprising:

at least two cycle counters; and means for synchronizing a count of at least one of said cycle counters with a reference clock signal; and an address generation circuit, said address generation circuit comprising:

at least two address counters, being equal in number to said at least two cycle counters;

a decoder receiving outputs from said at least two cycle counters and providing timing signals to said at least two address counters; and multiplexing means for choosing among outputs of said at least two address counters, thereby selecting a memory address, wherein one of said at least two cycle counters repeatedly counts a high speed clock at a basic period and generates a basic period pulse, the count of this one of said at least two cycle counters being synchronized by said synchronizing means, and wherein at least one other one of said at least two cycle counters repeatedly counts said basic period pulse at a time division period that is an integral multiple of said basic period and generates a time division period pulse that has a period equal to said time division period.

16. A sequence controller in accordance with claim 15, further comprising:

a memory receiving said memory address and reading out associated information; and a decoder receiving said associated information and supplying control signals.

* * * * *